United States Patent [19]

Munier

[11] Patent Number: 4,775,798
[45] Date of Patent: Oct. 4, 1988

[54] DEVICE FOR DETECTION WITH TIME DELAY AND PHASE INTEGRATION

[75] Inventor: Bernard Munier, Seyssinet, France

[73] Assignee: Thomson-CSF, Paris, France

[21] Appl. No.: 867,465

[22] Filed: May 23, 1986

[30] Foreign Application Priority Data

May 30, 1985 [FR] France .................. 85 08165
Sep. 27, 1985 [FR] France .................. 85 14376

[51] Int. Cl.⁴ .............. H04N 5/335; H01L 27/14; H01L 31/14; G11C 19/28
[52] U.S. Cl. ............... 250/578; 358/213.23; 358/213.29
[58] Field of Search ............. 250/578, 211 J; 357/30 H, 30 D, 31, 32; 358/212, 213.23, 213.29

[56] References Cited

U.S. PATENT DOCUMENTS

| | | | |
|---|---|---|---|
| 4,327,377 | 4/1982 | Takken | 358/199 |
| 4,382,187 | 5/1983 | Fraleux et al. | 250/578 |
| 4,544,848 | 9/1985 | Kawasaki et al. | 250/578 |
| 4,571,626 | 2/1986 | Yamada | 350/212 |
| 4,609,943 | 9/1986 | Munier | 358/213.29 |

FOREIGN PATENT DOCUMENTS

2554955  5/1985  France .

OTHER PUBLICATIONS

Patents Abstracts of Japan, vol. 5, No. 181 (E-83) [853], 20 Nov. 1981; & JP-A-56 109 076 (FUJITSU K.K.) 29-08-1981.

Primary Examiner—Edward P. Westin
Assistant Examiner—Charles Wieland
Attorney, Agent, or Firm—Roland Plottel

[57] ABSTRACT

The device for detection with time delay and phase integration comprises detectors arranged in rows and columns. Capacitors for storing electric charges are associated with each detector. Any one point of the image is received sequentially by the detectors of a given row and each column of detectors is addressed sequentially by a shift register. The data stored by the detectors of a given row are received sequentially on a common lead by a charge-coupled device associated with each row. The function of this device is to delay the data delivered by the detectors of the same row in order to add these data in synchronism. The charge-coupled devices are located externally with respect to the rows of detectors. Their outputs are connected as feedback to their inputs in order to re-inject into the device the information previously received from a detector in phase with the information received from the following detector of the same row.

12 Claims, 9 Drawing Sheets

FIG_1

FIG_2

FIG_3

FIG_4-a

FIG_4-b

FIG_4-c

FIG_4-d

FIG_5-a $V_{R_1}$

FIG_5-b $V_{R_2}$

FIG_5-c $V_{R_3}$

FIG_5-d $V_{R_4}$

FIG_5-e $\phi_1$

FIG_5-f $\phi_2$

FIG_5-g $\phi_R$

FIG_5-h $\phi_L$

FIG_5-i $V_{d_4}$

FIG_5-j $V_5$

FIG_7

FIG_8

FIG_9-a $V_{R_1}$

FIG_9-b $V_{R_2}$

FIG_9-c $V_{R_3}$

FIG_9-d $V_{R_4}$

FIG_9-e $\phi_1$

FIG_9-f $\phi_2$

FIG_9-g $\phi_R$

FIG_9-h $V_{D_4}$

FIG_10

FIG_11

FIG_12

DEVICE FOR DETECTION WITH TIME DELAY AND PHASE INTEGRATION

BACKGROUND OF THE INVENTION

1. Field of the Invention

The present invention relates to a device for detection with time delay and phase integration.

2. Description of the Prior Art

In the prior art, known devices of this type usually comprise a plurality of linear arrays of detectors or detector strips which are parallel to each other, relative motion being intended to take place between the detectors and the image to be scanned. In other words, any one point of the image to be scanned is received sequentially by the detectors of any one row and the items of information or data collected at the different detectors are summated in synchronism with the movement of relative displacement.

This type of device is already known and is based on a principle designated in the literature as "Time Delay Integration" or TDI. The device makes it possible to multiply the integration time by a factor N which is equal to the number of detectors of each linear array or so-called row. Since reading noises are added quadratically, a gain in signal-to-noise ratio equal to $\sqrt{N}$ is obtained.

In the prior art, a charge-coupled shift register is usually placed between each row of detectors and the next row. The lateral inputs of this shift register are intended to receive the signals delivered by the detectors of any one row and these signals are added in synchronism by said register.

A problem is created, however, by the excessive bulk of registers having lateral inputs and placed between the rows of detectors.

This problem is particularly critical when the detection device is employed in the infrared region of the spectrum. In this region, the flux of photons received by the device is considerable and the same applies to the number of electric charges to be transported within each shift register. It is therefore found necessary to increase the width of the registers in order to permit storage of all the charges.

The present invention offers a solution to this problem.

In accordance with the invention, registers having lateral inputs and placed between the rows of detectors are no longer employed. For each row of detectors, provision is made for a charge-coupled device connected to the detectors by means of a single lead (or if necessary by means of two leads). This device is thus placed outside the photosensitive zone at a location other than between the rows of detectors. This arrangement accordingly has the effect of increasing the space available in the photosensitive zone and makes it possible, for example, to increase the charge integration time or to increase the resolution and therefore to improve the performances of the device.

It should also be pointed out that, in the prior art, the pitch adopted for the stages of the lateral-input shift registers placed between the rows of detectors was the same as the pitch or spacing between detectors. In accordance with the invention, the charge-coupled devices are no longer placed between the rows of detectors, with the result that the pitch of the register stages can be established without taking into account the pitch between detectors. In certain cases, it may be found necessary to employ a pitch of 25 micrometers between register stages whereas the pitch between the detectors is 100 micrometers. The result thereby achieved is to reduce the length of the charge-coupled devices and therefore their overall size. Efficiency of transfer is accordingly enhanced.

SUMMARY OF THE INVENTION

The present invention relates to a detection device with time delay and phase integration comprising detectors disposed in rows and columns, means for storing charges associated with each detector, any one point of the image being received sequentially by the detectors of a given row, and means for delaying data derived from the detectors of a given row in order to add them in synchronism. The distinctive features of the device are as follows:

each column of detectors is addressed sequentially by a shift register;

said data-delaying means are constituted by a charge-coupled device associated with each row of detectors, the data stored by the detectors of any one row being received sequentially on the same lead by said charge-coupled device, said charge-coupled devices being all positioned outside the rows of detectors.

The device in accordance with the invention for detection with time delay and phase integration can be employed in the visible spectrum as well as for the purpose of detecting x-rays or infrared radiation, for example.

In the description given hereinafter, consideration will be given to the particular case of devices which are sensitive in the infrared region and within the spectral band of 8 to 12 micrometers in which the problem stated earlier is particularly critical.

BRIEF DESCRIPTION OF THE DRAWINGS

Other features of the invention will be more apparent upon consideration of the following description and accompanying drawings, wherein:

FIGS. 5aa to 5j are waveform diagrams of different clock signals applied to the device in accordance with the invention;

FIGS. 9a to 9h are waveform diagrams of different clock signals applied to one embodiment of the device in accordance with the invention;

In the different figures, the same references designate the same elements but the dimensions and proportions of the various elements have not been observed for reasons of clarity.

DESCRIPTION OF THE PREFERRED EMBODIMENTS

In the different diagrams, the devices for accurate synchronization which come within the sphere of current technology have not been illustrated for the sake of enhanced clarity and simplification of the description.

Figure 1:
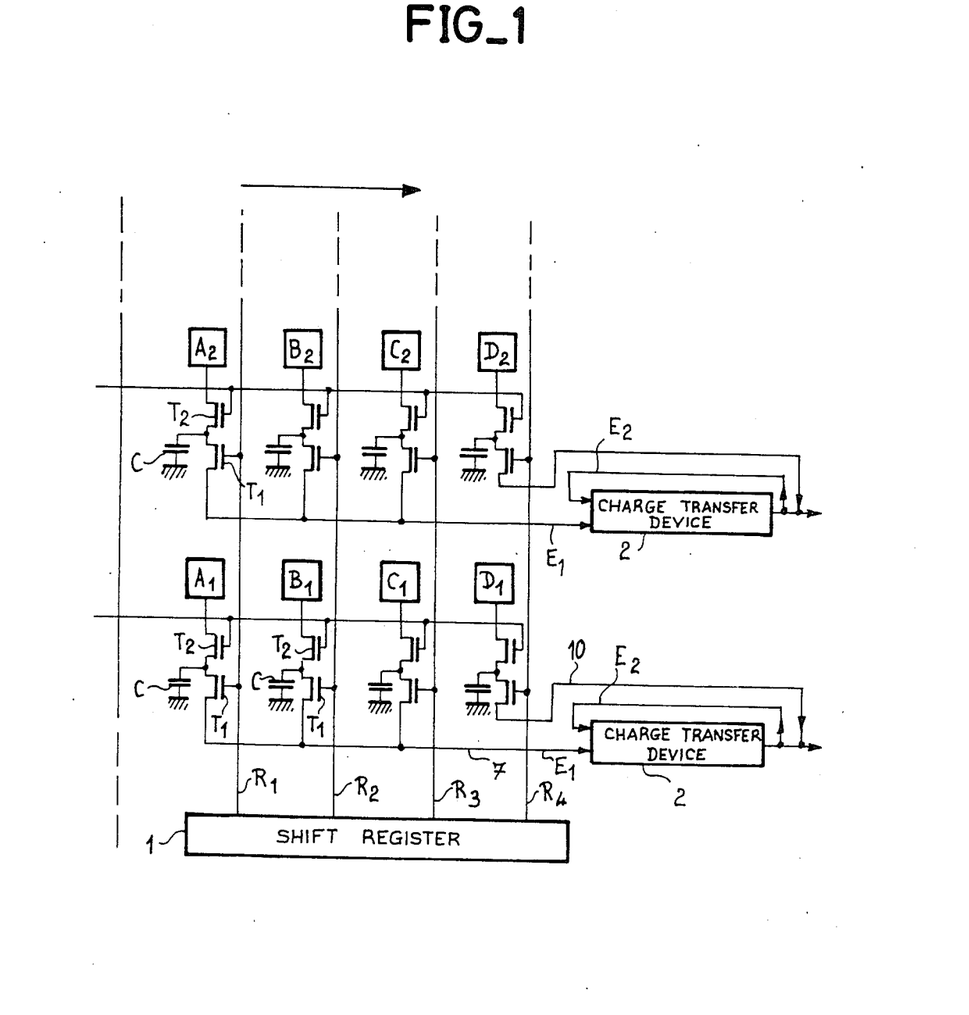
FIG. 1 is a diagram of one embodiment of a device in accordance with the invention for detection with time delay and phase integration.

The schematic diagram of FIG. 1 illustrates one embodiment of a device in accordance with the invention for detection with time delay and phase integration.

The device of FIG. 1 comprises only two rows of four detectors designated by the references $A_1$, $B_1$, $C_1$, $D_1$ and $A_2$, $B_2$, $C_2$, $D_2$.

It will be readily understood that, in actual practice, the device in accordance with the invention comprises a large number of rows such as two hundred, for example, and that each row comprises a plurality of detectors which may be eight in number, for example.

The detectors $A_1$, $B_1$, $C_1$, $D_1$, $A_2$, $B_2$, $C_2$, $D_2$, are disposed in rows and columns.

In the case of infrared radiation detection, the detectors are formed on a semiconductor substrate which is different from the substrate on which the other elements are formed, that is to say elements such as those designated by the references C, $T_1$, $T_2$ and the device 2 in FIG. 1. By way of example, the detectors are formed on a semiconductor substrate of HgCdTe whereas the remainder of the device is formed on a p-type silicon substrate.

In FIG. 1, the direction of relative displacement of the image to be scanned in front of the detectors is indicated by an arrow directed from left to right at the top of the figure.

Each point of the image to be scanned is therefore "seen" successively by the detectors $A_1$, $B_1$, $C_1$ and then $D_1$ in the case of the bottom row and by the detectors $A_2$, $B_2$, $C_2$ and $D_2$ in the case of the top row.

There are associated with each detector:

means for storing charges represented schematically in FIG. 1 by a capacitor C;

an element which has the function of injecting the charges of the detectors into the capacitors C and is represented schematically by MOS transistors $T_2$. These transistors $T_2$ are connected between a detector and one terminal of each capacitor C whilst the other terminal of said capacitor C is connected to ground or to a constant potential. The gates of the transistors $T_2$ associated with the detectors of any one row are connected to each other and receive a control voltage which leaves these transistors in the conducting state during at least part of the read time;

a switching element controlled by a shift register 1 which addresses each column of detectors sequentially. This switching element is represented schematically in FIG. 1 by an MOS transistor $T_1$. Except for the transistor which is associated with the last detector, said transistors $T_1$ are connected between the ungrounded terminal of each capacitor C and a lead which is common to the detectors of any one row, said common lead being connected to one input $E_1$ of the charge-coupled device 2 which is associated with said row. The gates of the transistor $T_1$ are controlled by the outputs $R_1$, $R_2$, $R_3$, $R_4$ of the register 1.

The charge-coupled devices 2 associated with each row of detectors are located outside the photosensitive zone or in other words outside the zone of detectors.

In order to achieve a reduction in overall size, the charge-coupled devices 2 can be arranged in staggered relation.

The operation of these devices will be explained in detail in the description given hereinafter with reference to FIGS. 2 to 6.

It is apparent from FIG. 1 that the output of each charge-coupled device 2 is connected to a second input $E_2$. The information previously received from one detector is thus re-injected into the device in phase with the information received from the following detector in the same row. It is further apparent from FIG. 1 that the lead carrying the information supplied by the detectors $D_1$ and $D_2$ is connected directly to the output of the charge-coupled devices 2 which are associated with each row of detectors.

Figure 2:
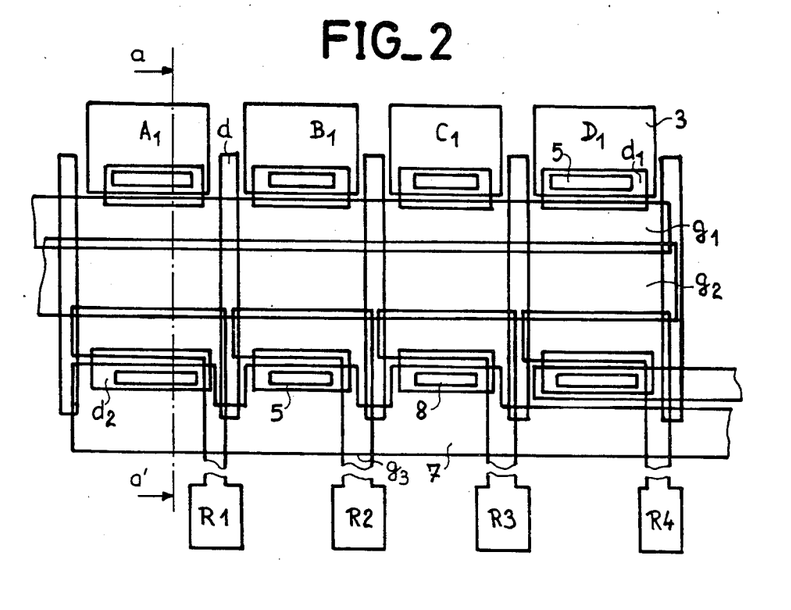
FIG. 2 is a top view of an embodiment in integrated form of the different elements associated with each detector.

FIG. 2 is an overhead view of an embodiment in the form of an integrated circuit structure in which the different elements connected to each detector are represented schematically in FIG. 1 by the MOS transistors $T_1$ and $T_2$ and the capacitor C.

In FIG. 2, there are shown only the elements which are connected to the detectors $A_1$, $B_1$, $C_1$ and $D_1$ of FIG. 1.

At the top of FIG. 2, there are shown metal contacts 3 connected to the detectors $A_1$, $B_1$, $C_1$ and $D_1$ which are not illustrated. In order to permit identification, the metal contact to which each detector is connected bears the reference of said detector. In the case of infrared radiation, these detectors usually consist of photodiodes.

Each contact 3 is connected to a diode $d_1$ integrated in a semiconductor substrate 4 by means of an opening 5 formed in the insulator 6 which protects the surface of the semiconductor substrate.

Figure 4A:
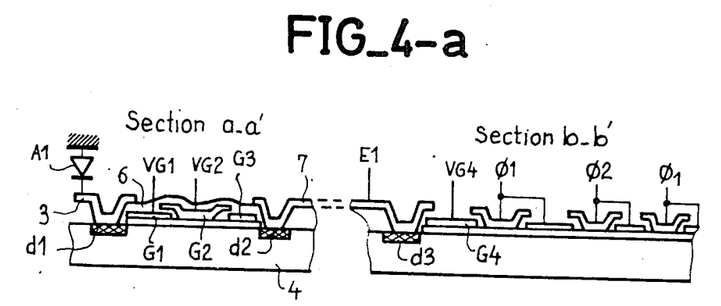
FIGS. 4a to 4d and 6a to 6e are views in cross-section through the devices of FIGS. 2 and 3 and diagrams illustrating the operation of these devices.

The left-hand portion of FIG. 4a is a sectional view which is taken along the axis a—a' indicated in FIG. 2 and in which are shown the elements 3, 4, 6, $d_1$ referred-to in the previous paragraph.

The diodes $d_1$ are followed by two gates $G_1$ and $G_2$ which receive constant bias voltages $V_{G1}$ and $V_{G2}$, then by gates $G_3$, there is a gate $G_3$ for each detector as shown in FIG. 2 but the grids $G_3$ of each column are interconnected. Isolating zones d ensure transfer of the charges from a given detector beneath the gates $G_1$ and $G_2$, then beneath the gate $G_3$ of this detector.

It is possible to make use of pulsed bias voltages $V_{G1}$ and $V_{G2}$.

By way of example, the time of integration of the charges can be adapted in the event of overexposure by switching the voltage $V_{G1}$ to the low level.

Similarly, the voltage $V_{G2}$ can be switched to the low level in order to improve the charge transfer process.

The gates $G_3$ are controlled by the outputs $R_1$, $R_2$, $R_3$, $R_4$ of the shift register 1.

After the gates $G_3$, provision is made for a diode $d_2$ associated with each detector. By virtue of openings 8 formed through the oxide layer 6, a lead 7 connects the diodes $d_2$ associated with the detectors of any one row to an input $E_1$ of the charge-coupled device 2 which is associated with said row of detectors. Only the diode $d_2$ which is associated with the last detector $D_1$ is not connected to lead 7 but is connected directly to the output of the charge-coupled device 2.

Figure 3:
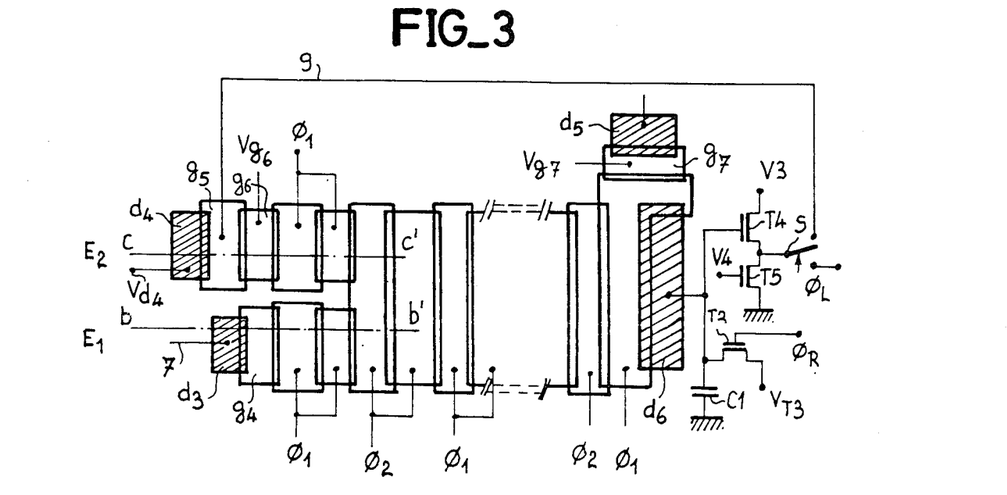
FIG. 3 is a top view of an embodiment in integrated form of the charge-coupled device associated with each row of detectors.

FIG. 3 is a top view of one embodiment in integrated form of the charge-coupled device 2 which is associated with each row of detectors.

FIG. 3 illustrates an embodiment of the device 2 which makes use of a known method for injecting charges into a charge-coupled device. A number of different alternative embodiments of the device 2 may be employed by modifying the mode of injection of charges, thus entailing the need for slight structural changes.

Figures 6A, 6B:
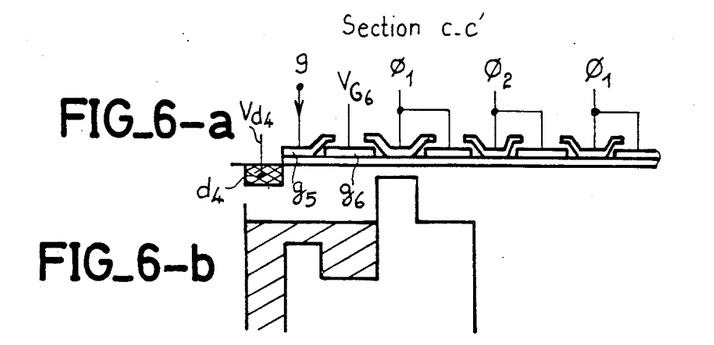

As has been seen in FIG. 1, this device has two inputs $E_1$ and $E_2$. The right-hand portion of FIG. 4a and FIG. 6a are sectional views which are taken along the axes b—b' and c—c' and show the structure of the inputs of the device 2.

The inputs $E_1$ and $E_2$ each comprise a diode $d_3$ and $d_4$ followed by a series of MOS capacitor gates.

The diode $d_3$ is connected to the lead 7 and is followed by a gate $G_4$ which is brought to a constant potential $V_{G4}$.

Figure 5A:
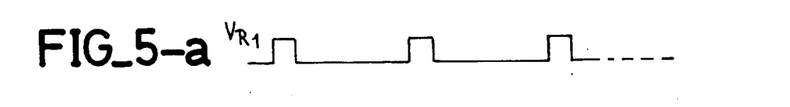
Figure 5B:
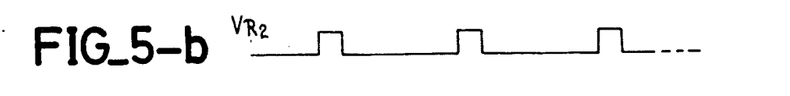
Figure 5C:
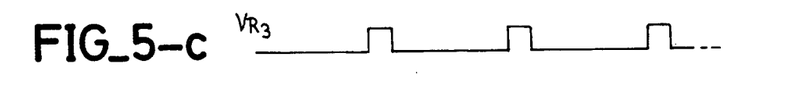
Figure 5D:
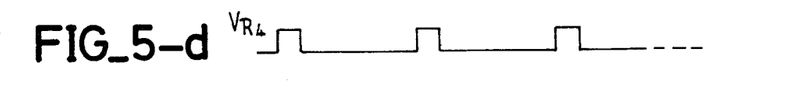
Figure 5E:
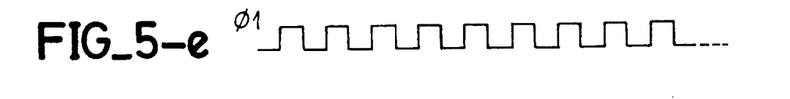
Figure 5F:
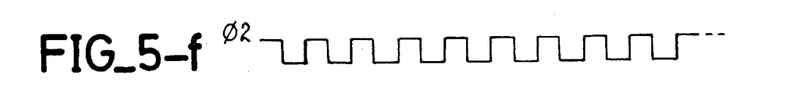
Figure 5G:
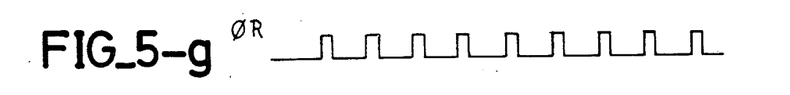
Figure 5H:
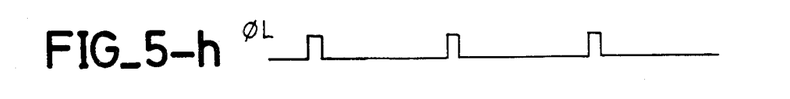
Figure 5I:
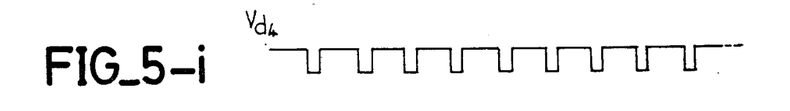

The diode $d_4$ receives a pulsed bias voltage $V_{d4}$, the representative waveform of which is shown in FIG. 5i. Said diode is followed by a gate $G_5$ to which the output voltage of the device 2 is applied via the lead 9 and by a gate $G_6$ to which a constant bias voltage $V_{G6}$ is applied.

It is apparent from FIG. 3 that, after the gates $G_4$, $G_5$ and $G_6$, the two inputs $E_1$ and $E_2$ also comprise a pair of gates specifically assigned to each input and followed in turn by pairs of gates located in a single channel into which are delivered charges derived from the two inputs $E_1$ and $E_2$. These pairs of gates receive clock signals $\phi_1$ and $\phi_2$ in phase opposition, the representative waveforms of which are shown in FIGS. 5e and 5f.

The charge-coupled device which is illustrated in FIG. 3 also comprises an output diode $d_6$ connected to a read stage comprising a read capacitor $C_1$, an MOS transistor $T_3$ for resetting the capacitor to zero. Said transistor receives a clock signal $\phi_R$ with a representative waveform as shown in FIG. 5g and a constant bias voltage $V_{T3}$. The output diode $d_6$ is also connected to a charge-reading device consisting of two MOS transistors $T_4$ and $T_5$ mounted as emitter-followers for delivering an output signal S.

Said output signal S can be re-injected at the input $E_2$ via the lead 9 or transmitted to the output of the device.

This alternative arrangement is represented schematically in FIG. 3 by a switch which receives the clock signal $\phi_L$ having the representative waveform shown in FIG. 5h.

The charge-coupled device 2 of FIG. 3 further comprises a diode $d_5$ followed by a gate $G_7$ at a constant potential $V_{G7}$ which permits injection of charges delivered by the last detector $D_1$.

In the foregoing description, consideration has been given to the example of a p-type substrate to which control voltages are applied, these voltages being positive when they are at the high level.

FIGS. 4b to 4d and 6b to 6e illustrate the operation of the device in accordance with the invention and represent the potentials within the semiconductor substrate at different instants.

Figure 4B:
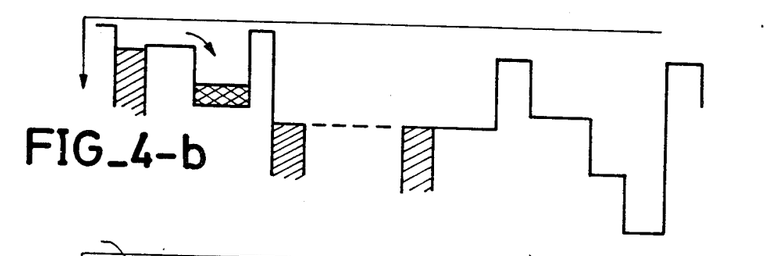

FIG. 4b shows the integration beneath the gate $G_2$ of charges delivered by the detector $D_1$. The charges injected via the diode $d_1$ pass through the channel located beneath the gate $G_1$ and accumulate within a storage well located beneath the gate $G_2$.

Figure 4C:
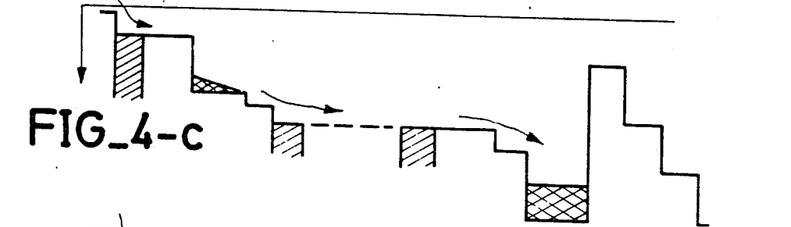

FIG. 4c shows the transfer of charges stored beneath the gate $G_2$ within the charge-coupled device. This transfer is initiated by modification of the potential applied to the gate $G_3$ which is connected to the output $R_1$ of the register 1 and receives the voltage $V_{R1}$. In FIGS. 5a to 5d, there are shown the voltages at the outputs $R_1$ to $R_4$ of the shift register 1. Transition of the output $R_1$ to the high level permits transfer of the charges to the diode $d_3$ and the gate $G_4$.

Transition of the clock signal $\phi_1$ to the high level permits transfer of the charges to the remainder of the device 2.

Figure 4D:
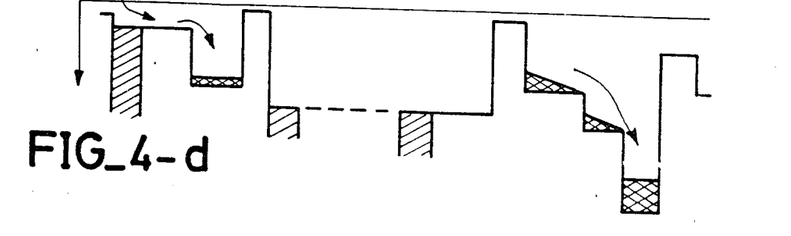

In FIG. 4d, the clock signal $\phi_2$ is at the high level and the clock signal $\phi_1$ is at the low level. There accordingly takes place a transfer of charges beneath a pair of electrodes associated with the clock signal $\phi_2$.

FIG. 6b represents the potentials within the substrate at an instant when the signal is at the low level. The signal which is available at the output of the device 2 is applied to the gate $G_5$ via the lead 9. The clock signal $\phi_1$ is at the low level.

Figure 6C:
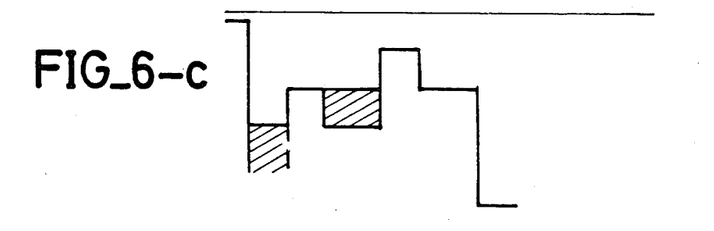

FIG. 6c represents the potentials at an instant when the signal $V_{d4}$ is at the high level.

The quantity of charge stored beneath the gate $G_6$ is directly a function of the signal transmitted via the lead 9.

Figure 6D:
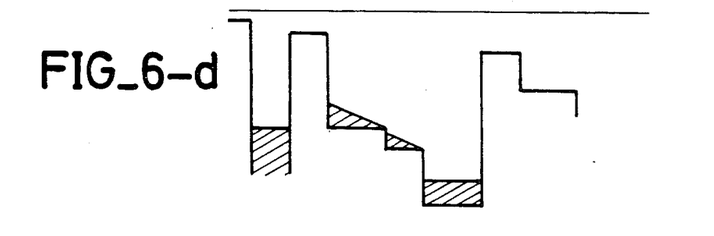
Figure 6E:
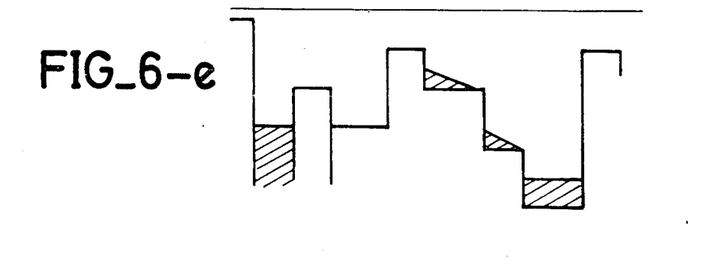

FIG. 6d represents the potentials within the substrate at an instant when the clock signal $\phi_1$ at the high level. The charges stored beneath the gate $G_6$ are transferred beneath a pair of electrodes which receive the signal 100 2, then beneath a pair of electrodes which receive the signal $\phi_1$ (see FIG. 6e).

In FIGS. 5a to 5i, there are shown the voltages $V_{R1}$, $V_{R2}$, $V_{R3}$, $V_{R4}$ which are available at the outputs $R_1$ to $R_4$ of the shift register 1, then the clock signals $\phi_1$ and $\phi_2$ which initiate transfer into the charge-coupled devices 2, and then the signals $\phi_R$ and $\phi_L$ applied at the output of the shift registers 2 and the signal $V_{d4}$ applied to the diode $d_4$.

It should be pointed out that, in FIGS. 5a to 5i as in FIGS. 9a to 9h, the voltages vary between a high level and a low level which can correspond to different values.

It will be observed in these figures that the signals $V_{R1}$ and $V_{R4}$ coincide. This arises from the fact that the signals delivered by the last detectors $D_1$, $D_2$, $D_3$, etc. do not pass through the charge-coupled device. It is therefore possible to send the signals delivered by the first detectors $A_1$, $A_2$, $A_3$, etc. to the input $E_1$ of the shift register whereas the signals delivered by the last detectors $D_1$, $D_2$, $D_3$ and so on are sent to the output of the register.

When the signal $\phi_L$ shown in FIG. 5h is at the low level, said signal initiates transfer of the signal S on the lead 9 in order to re-inject said signal at the input $E_2$.

When the signals delivered by the detectors $A_1$, $B_1$, $C_1$ have been delayed and summated within the charge-coupled device 2, the signal $\phi_L$ undergoes a transition to the high level. This transition of $\phi_L$ to the high level takes place when the signal has changed-over from the high level to the low level. The signal delivered by the detector $D_1$ is then available at the diode $d_5$ and the cumulated signals of the detectors $A_1$, $B_1$, $C_1$; $D_1$ in respect of the same image point are available at the diode $d_6$. The resultant signal S is transmitted to the exterior of the charge-coupled device.

The signal $\phi_R$ which is represented in FIG. 5g undergoes a transition to the high level after the changeover of the signal $\phi_L$ to the low level.

In order to obtain satisfactory operation, it is necessary to carry out simultaneous adaptation of the values of different parameters such as the number of stages of the charge-coupled devices 2, the operating frequencies of the shift register 1, of the devices 2, the rate of travel of the image.

In the case of FIGS. 1 to 6, the information derived from the detector $A_1$ is transferred within the device 2 and re-introduced at the input $E_2$ in synchronism with the arrival at the input $E_1$ of the information derived from the detector $C_1$ corresponding to the same point of the image.

Summation of the data obtained from the detectors $A_1$ and $B_1$ takes place within the device 2. This cumulated information is again transferred into the device 2 and re-introduced at the input $E_2$ while the information derived from the detector $C_1$ in respect of one and the same point of the image is received at the same time by the input $E_1$.

Summation of the data produced by the detectors $A_1$, $B_1$ and $C_1$ takes place within the device 2.

The data delivered by the detectors $A_1$, $B_1$ and $C_1$ are summated with the information derived from the detector $D_1$ in respect of one and the same point of the image which is injected directly at the output of the device in the diode $d_5$.

A signal S is therefore provided and represents the sum of data delivered by the detectors $A_1$, $B_1$, $C_1$ and $D_1$ of any one row in respect of one and the same point of the image. Said signal S is transmitted to the exterior of the charge-coupled device 2.

It will be readily apparent that the charge-coupled devices 2 process simultaneously the data delivered by the detectors of any one row in respect of a number of different points of the image.

Figure 7:
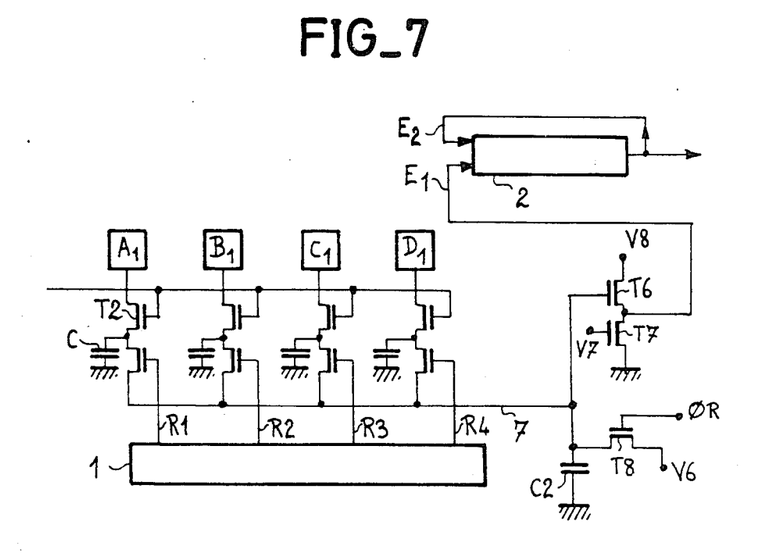
FIG. 7 is a diagram of another embodiment of a device in accordance with the invention for detection with time delay and phase integration.
Figure 8:
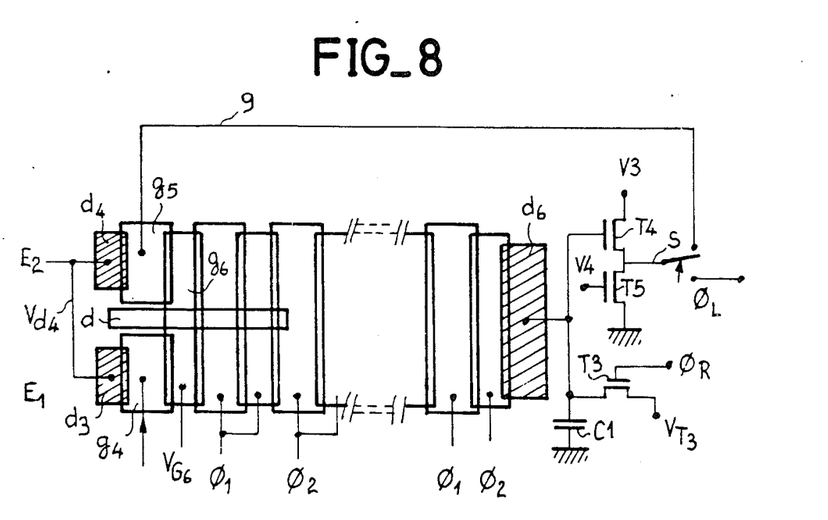
FIG. 8 is a top view of another embodiment in integrated form of the charge-coupled device associated with each row of detectors.

FIGS. 7 to 9 illustrate different alternative embodiments of the device described earlier.

FIG. 7 is a diagram illustrating one embodiment of the device in accordance with the invention.

This diagram differs from that of FIG. 1, especially in regard to the fact that it shows only a single row of detectors $A_1$, $B_1$, $C_1$ and $D_1$ but also because it involves two alternative embodiments which will be explained hereinafter.

One of the alternative embodiments consists in conveying through the charge-coupled device 2 the information delivered by the last detector $D_1$.

Figure 9A:
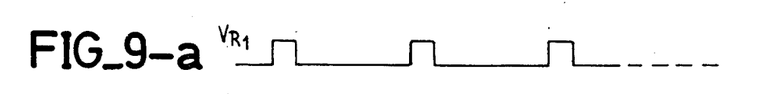
Figure 9B:
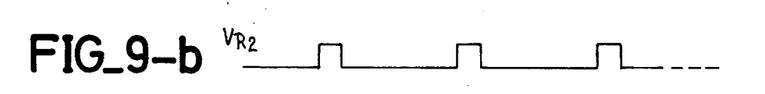
Figure 9C:
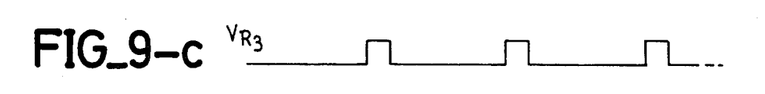
Figure 9D:
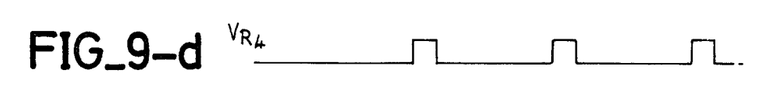
Figure 9E:
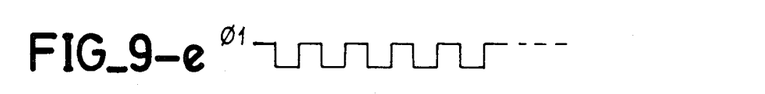
Figure 9F:
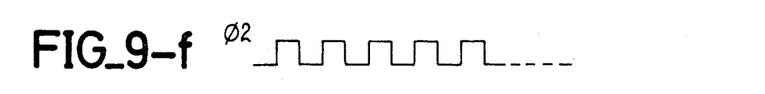

This modification entails the need to modify the control signal $V_{R4}$ which is represented in FIG. 9d. The signal $V_{R4}$ no longer coincides with the signal $V_{R1}$. It is apparent from FIGS. 9a to 9d d that the signals $V_{R1}$, $V_{R2}$, $V_{R3}$ and $V_{R4}$ undergo sequential transitions to the high level.

This alternative embodiment makes it necessary to increase the number of stages of the charge-coupled device 2 in order to ensure that the data derived from the various points of the image do not coincide in the shift register.

It is thus possible for example to employ charge-coupled devices 2 comprising ten stages when the information provided by the detectors $D_1$, $D_2$, $D_3$ and so on is delivered directly to the output of said devices. In contrast, when the information from these detectors passes through the devices 2, it is necessary to use thirteen stages.

Another alternative embodiment of the device of FIG. 7 relates to the interposition of a charge-reading stage between the input $E_1$ of the charge-coupled device 2 and the connecting lead 7 by which the information is transported sequentially from the detectors of one and the same row.

Said reading stage comprises a capacitor $C_2$ for storing the charges transmitted via the lead 7. The charges stored in the capacitor $C_2$ are converted to voltage by means of an amplifier constituted by two transistors $T_6$ and $T_7$. By way of example, these two transistors are series-connected MOS transistors. The input is provided by the gate of transistor $T_6$ which receives a constant bias voltage on one of its electrodes. The transistor $T_7$ is connected to ground and a constant bias voltage $V_7$ is applied to the gate of said transistor. The common node of transistors $T_6$ and $T_7$ constitutes the output of this amplifier, said output being connected to the input $E_1$ of the device 2.

Figure 9G:
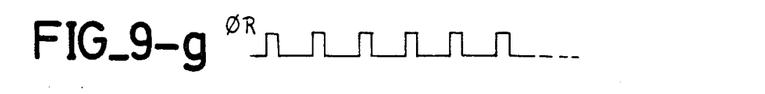
Figure 9H:
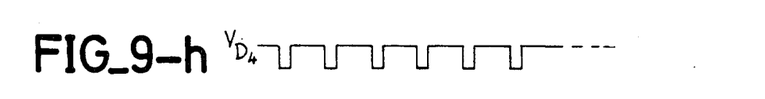

An MOS transistor $T_8$ permits periodic zero resetting of capacitor $C_2$. The clock signal $\phi_R$ shown in FIG. 9g is applied to the gate of said transistor $T_8$ One of its electrodes receives a constant bias voltage $V_6$ which also controls the transistor $T_3$ connected to the output of the device 2.

The overhead view of FIG. 8 illustrates an integrated-circuit embodiment of the charge-coupled device which is associated with each row of detectors.

This embodiment of the charge-coupled device 2 is employed in the case of FIG. 7 in which a read stage precedes said device 2.

In this case, the two inputs $E_1$ and $E_2$ of the device 2 are identical and similar to the input $E_2$ of the device shown in FIG. 3.

The inputs $E_1$ and $E_2$ therefore comprise two diodes $d_3$ and $d_4$ which receive a bias voltage $V_{d4}$. Each of these diodes is followed by a gate $G_4$ and $G_5$. The gate $G_4$ follows the diode $d_3$. Said gate $G_4$ is connected to the output of the reading device constituted by the transistors $T_6$ and $T_7$.

The gate $G_5$ follows the diode $d_4$.

As in the case of FIG. 3, said gate $G_5$ is connected to the output of the device 2 by means of the lead 9.

The gates $G_4$ and $G_5$ are followed by a gate $G_6$ which is brought to a constant voltage $V_{G6}$.

In this embodiment, the operation of the inputs $E_1$ and $E_2$ is of the same type as the operation of the input $E_2$ as set forth in FIGS. 6a to 6e.

The advantage of this form of construction lies in the fact that, if a gain of less than 1 is adopted, the use of an amplifying stage upstream of the input of the device 2 makes it possible to reduce the quantity of charges to be transported by the devices 2.

The result thereby achieved is a further reduction in overall size of the charge-coupled devices 2.

FIGS. 9a to 9h show representative waveforms of the clock signals $V_{R1}$ to $V_{R4}$, then the clock signals $\phi_1$, $\phi_2$, $\phi_R$ and $V_{D4}$. As has already been explained, the embodiment of FIGS. 7 and 8 entails the need for modification of the signal $V_{R4}$ which no longer coincides with the signal $V_{R1}$.

It has been mentioned that the device in accordance with the invention can be employed both in the visible spectrum and for the purpose of detecting infrared radiation.

In the case of detection of visible radiation, the detectors are photodiodes and/or MOS-phototransistors.

These detectors are associated with storage means which can be constituted by the detectors themselves.

In order to permit utilization in the visible spectrum, for example, the device shown in FIG. 2 has to be modified.

The gates $G_1$ and the diodes $d_1$ are suppressed. The remainder of the device shown in FIG. 2 does not need to be modified.

The detectors can consist of MOS-phototransistors constituted by the gates $G_2$ or by photodiodes which precede MOS-phototransistors constituted by the gates $G_2$ or only by MOS-phototransistors constituted by the gates $G_2$.

Figure 10:
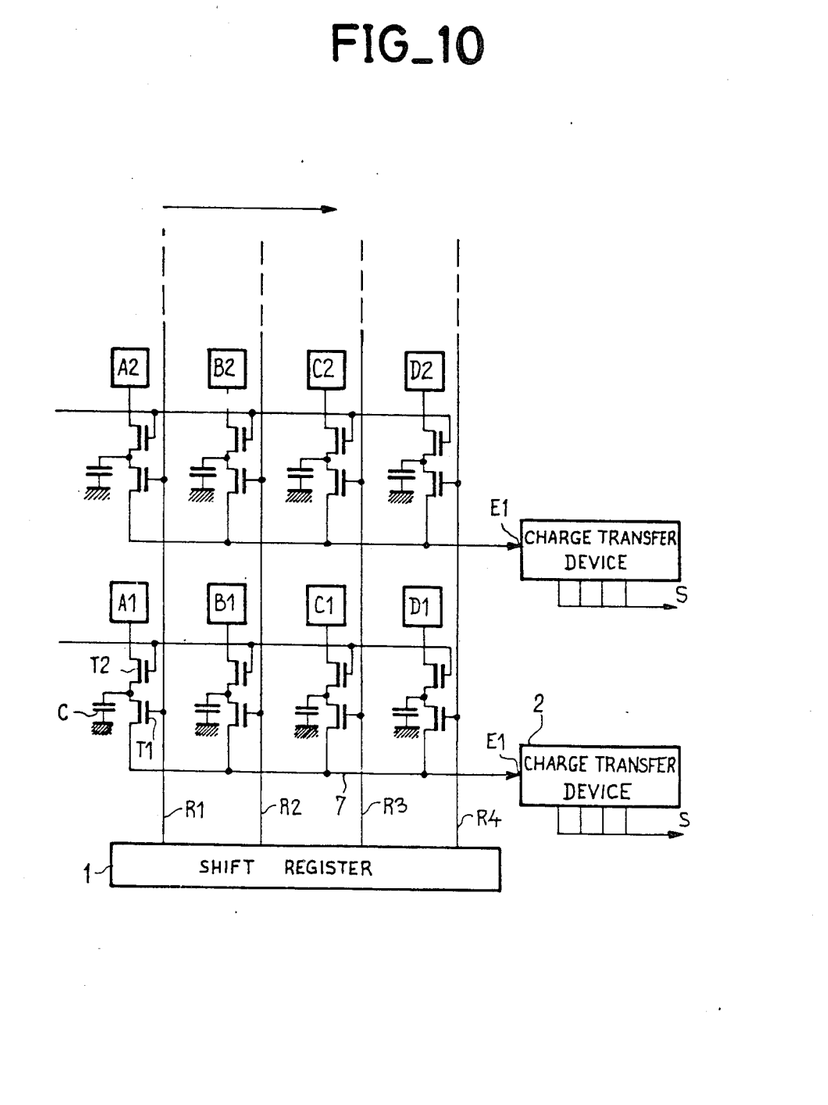
FIG. 10 is a diagram of another embodiment of a device in accordance with the invention.

The embodiment of the invention which is illustrated in FIG. 10 differs from the embodiment shown in FIG. 1 with respect to the following points:

all the transistors $T_1$ are connected between the terminal of each ungrounded capacitor C and the lead 7 which is common to the detectors of any one row and connected to the input $E_1$ of the charge-coupled device 2 associated with each row;

each charge-coupled device 2 comprises a number of lateral outputs corresponding to the number of detectors per row, namely four lateral outputs in FIG. 1 and summation of the signals available at said outputs, as represented schematically by conductors connected to each other, produces the required signal which appears on an output designated by the reference S.

The elements placed between the detectors and the charge-coupled devices 2 can be identical in the embodiments of FIGS. 1 and 10. One form of construction of these elements is illustrated in FIG. 2.

Figure 11:
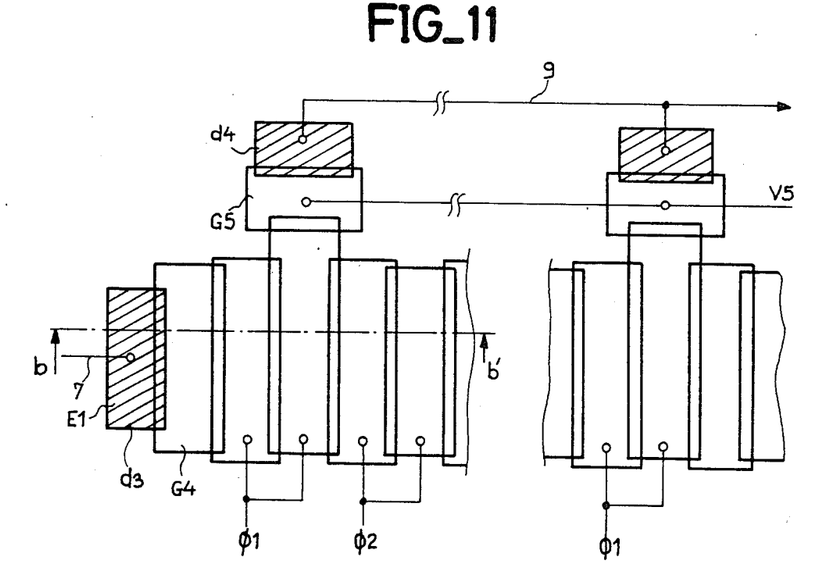
FIG. 11 is a top view of an embodiment in integrated form of the charge-coupled device associated with each row of detectors.

FIG. 11 is an overhead or top view of an integrated-circuit embodiment of the charge-coupled device associated with each row of detectors in the embodiment of FIG. 10; this view is completed in the right-hand portion of FIG. 4a by a cross-section taken along an axis b—b' indicated in FIG. 11.

The input $E_1$ comprises a diode $d_3$ connected to the lead 7 and followed by a series of MOS capacitor gates. The diode $d_3$ is followed by a gate $G_4$ brought to a constant potential $V_{G4}$.

After the gate $G_4$, the structure comprises pairs of gates for receiving clock signals $\phi_1$ and $\phi_2$ in phase opposition and having a frequency of 1 MHz, for example. The representative waveforms of these clock signals are shown in FIGS. 5e and 5f.

Figure 5J:
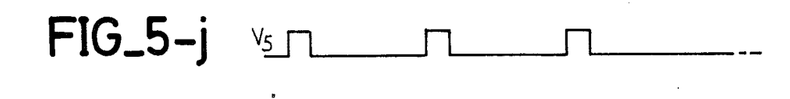

FIG. 11 also shows two of the lateral outputs of the charge-coupled device. Each output is constituted by a gate such as the gate $G_5$ and by a diode such as the diode $d_4$. The gates of the different outputs are connected to each other and brought to a potential $V_5$. The diodes such as $d_4$ are connected to each other by means of a lead 9 which constitutes the signal output of the charge-transfer circuit. The potential $V_5$ is represented in FIG. 5j by square-topped voltage pulses.

The operation of the device shown in FIG. 11 is illustrated in FIGS. 4b to 4d which have already been described.

At each new period of the signals $\phi_1$ and $\phi_2$, the charges delivered by the detector $A_1$ are transferred from one storage location to the next in the chargetransfer circuit. During this transfer operation, the charges originating from detector $B_1$ are injected into the input of the charge-transfer circuit, then transferred in turn. The charges originating from detectors $C_1$ and then $D_1$ are transferred in the same manner behind the charges delivered by the detector $B_1$. The succession of signals derived from detectors $A_1$, $B_1$, $C_1$ and $D_1$ are therefore contained in the potential wells of the charge-transfer circuit.

Thus, when an image point arrives in front of the detector $D_1$, it has been detected successively by the detectors $A_1$, $B_1$ and $C_1$ and the corresponding signals are present in the charge-transfer circuit. It is then only necessary to read these signals by means of the lateral outputs and to add them in order to obtain the output signal.

In the time-waveform diagram provided by way of example in FIGS. 5a to 5j, the signal $V_5$ is at the high level when the signal $V_{R1}$ and the signal $V_{R4}$ are at the high level and when the signal $\phi_1$ is also at the high level. In consequence, the signal $V_5$ undergoes a transition to the high level when the four detectors of one row have been read by virtue of the fact that signals $V_{R1}$, $V_{R2}$, $V_{R3}$ and $V_{R4}$ shifted successively to the high level. The read signal from the last detector of the row such as the detector $D_1$, for example, is transferred beneath the pair of gates which receives the signal $\phi_1$ and which immediately follows the gate $G_4$. As a result of transition of signal $V_5$ to the high level, the gate $G_5$ which is connected to the pair of gates aforesaid permits transfer of the charges which correspond to reading of detector $D_1$. The potential of the corresponding diode $d_4$ is modified. At the same time, the quantities of charges which correspond to reading of the other detectors of the same row or in other words the detectors $A_1$, $B_1$ and $C_1$ are transferred through the gates $G_5$ to the diodes $d_4$. The output signal corresponding to addition of the charges derived from detectors $A_1$, $B_1$, $C_1$ and $D_1$ is therefore obtained on the lead 9 which is connected to the diodes $d_4$.

The charge-transfer circuit must have a sufficient number of stages to store all these data. The number of stages required is $$N(N-1)\frac{t_2}{t_1} + N$$

where N is the number of detectors per row,
  $t_1$ the time which elapses between two image-reading operations performed by a detector,
  $t_2$ is the time taken by one image point to shift from one detector to the next.

By way of example, if $N=4$, $t_2/t_1=4$, the number of stages of the circuit is 52.

The lateral outputs (N in number) of the charge-transfer circuit are located at the level of the first stage and of the last stage whilst the other outputs are spaced at uniform intervals along the circuit.

Figure 12:
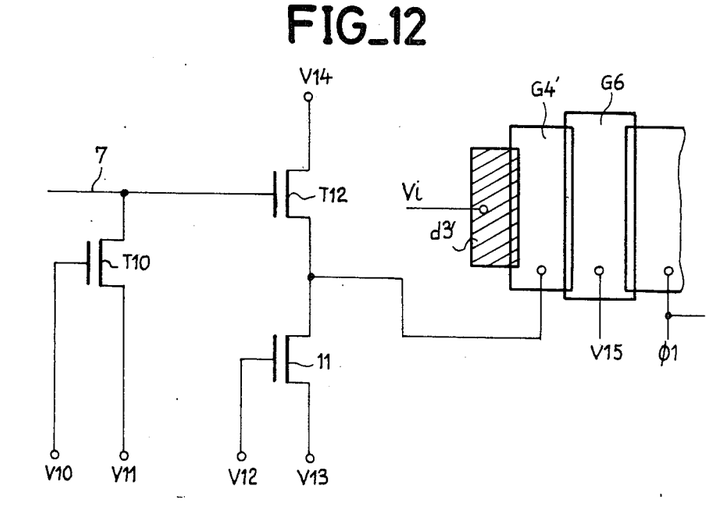
FIG. 12 is a partial diagram of an alternative embodiment of a device in accordance with the invention.

An alternative embodiment of the device shown in FIG. 10 consists in interposing an amplifier between the connection such as the lead 7 and the charge-transfer circuit such as the device 2 of each row, the function of said amplifier being to convert the electric charges to a potential. FIG. 12 shows a possible arrangement of an amplifier of this type as well as the input stage of the charge-transfer circuit.

FIG. 12 shows that, in this alternative embodiment, the lead 7 is connected to an MOS transistor $T_{10}$ which serves to restore the level of the lead 7 and to two MOS transistors $T_{11}$ and $T_{12}$ mounted as follower amplifiers. The transistor $T_{10}$ connects the lead 7 to a 10-volt direct-current voltage source $V_{11}$ and the control voltage $V_{10}$ of the transistor gate is a zero-resetting pulse. The transistors $T_{11}$ and $T_{12}$ are mounted between two direct-current voltage sources. $V_{13}$ and $V_{14}$ Bhaving values of 0 volt and +15 volts respectively and the transistor gates are connected respectively to a 0-volt direct-current voltage source $V_{12}$ and to the lead 7 whilst the common terminal of these transistors is connected to the input of a charge-transfer circuit which is capable of receiving a signal in the form of a voltage. The charge-transfer circuit which is shown in FIG. 6 only to a partial extent comprises a diode $d_3'$ followed by a series of MOS capacitor gates $G_4'$, then $G_6$, and so on. The gate $G_4'$ receives the signal from transistor $T_{12}$ and the diode $d_3'$ receives a signal $V_i$ formed by a succession of pulses which are synchronized with the arrival of the signal on gate $G_4'$. The gate $G_6$ is biased at a constant potential $V_{15}$ of 5 volts. The remainder of the charge-transfer circuit is not illustrated but is identical with the circuit shown in FIG. 11 and consists of elements which follow the gate $G_4$ in this figure.

By virtue of the amplifier $T_{11}$-$T_{12}$ having a gain of less than 1 employed in the alternative embodiment of FIG. 12, the advantage of this embodiment lies in the fact that it permits a reduction in dimensions of the charge-coupled device in an applications in which minimum bulk is an essential requirement.

What is claimed is:

1. A detection device comprising photodetectors disposed in rows and columns, for the scanning of an image, means for storing charges associated with each detector, a shift register addressing sequentially each column of detectors for reading, wherein said detection device acts with time delay and phase integration, any one point of the image being received sequentially by the detectors of a given row, and means for delaying data derived from the detectors of a given row in order to add said data in synchronism said means being constituted by a charge coupled device, associated with each row of detectors, said charge coupled device providing in its output the sum of the delayed data of given row.

2. A device according to claim 1, wherein an output of each charge-coupled device is connected as feedback to a charge-couled device input in order to re-inject into the device the information previously received from a detector in phase with the information received from the following detector of the same row.

3. A device according to claim 2, wherein the information stored by the storage means associated with the detector of each row which is the last to receive each image point s sent directly to the output of the charge-coupled device associated with said row of detectors.

4. A device according to claim 1, wherein each charge-coupled device has lateral outputs coupled to each other in order to permit summation in synchronism of the information signals received by the circuit.

5. A device according to claim 1, wherein the detectors are photodiodes, each photodiode being connected to a first diode followed by two gates, by a third gate controlled by said shift register and by a second diode connected via a lead to the charge-coupled device associated with each row of detectors, the diodes and the gates being integrated on a semiconductor substrate.

6. A device according to claim 1, wherein said device is employed for detecting visible radiation and wherein the detectors are photodiodes and/or MOS-phototransistors, each detector being connected to a gate which can form part of the detector, said gate being followed by a gate controlled by said shift register and by a diode connected via a lead to the charge-coupled device associated with each row of detectors.

7. A device according to claim 1, wherein each charge-coupled device has a first and a second input, the first input being connected to the lead aforesaid and the output voltage of the device being received by the second input.

8. A device according to claim 7, wherein a charge-reading stage is interposed between the lead aforesaid and the charge-coupled device associated with each row of detectors.

9. A device according to claim 7, wherein the first input comprises a diode integrated in the semiconductor substrate, said diode being connected to the lead aforesaid and a second input being provided with a diode for receiving a pulsed voltage followed by a gate for receiving the output voltage of the device and then by another gate which receives a constant bias voltage.

10. A device according to claim 8, wherein each charge-coupled device has a first input and a second input with a diode for receiving the same pulsed voltage followed by a first gate and by a second gate, one of said first gates being connected to the output of the reading stage associated with each row of detectors and the other first gate receives the output voltage of the charge-coupled device whereas the second gate receives a constant bias voltage.

11. A device according to claim 4, wherein the charge-coupled devices are preceded by an amplifier having a gain of less than 1.

12. A device according to claim 8, wherein the first input comprises a diode integrated in the semiconductor substrate and connected to the lead aforesaid and wherein a second input comprises a diode for receiving a pulsed voltage followed by a gate for receiving the output voltage of the device and then by another gate for receiving a constant bias voltage.

* * * * *